United States Patent
Gao et al.

(10) Patent No.: US 9,755,187 B2
(45) Date of Patent: Sep. 5, 2017

(54) ORGANIC LIGHT-EMITTING DIODE PACKAGING STRUCTURE, METHOD FOR PACKAGING ORGANIC LIGHT-EMITTING DIODE, AND DISPLAY DEVICE

(71) Applicant: BOE TECHNOLOGY GROUP CO., LTD., Beijing (CN)

(72) Inventors: Jing Gao, Beijing (CN); Song Zhang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/915,519

(22) PCT Filed: Aug. 10, 2015

(86) PCT No.: PCT/CN2015/086445
§ 371 (c)(1),
(2) Date: Feb. 29, 2016

(87) PCT Pub. No.: WO2016/145770
PCT Pub. Date: Sep. 22, 2016

(65) Prior Publication Data
US 2017/0040572 A1 Feb. 9, 2017

(30) Foreign Application Priority Data

Mar. 17, 2015 (CN) .......................... 2015 1 0116857

(51) Int. Cl.
*H01L 51/52* (2006.01)
*H01L 51/56* (2006.01)
*H01L 51/00* (2006.01)

(52) U.S. Cl.
CPC ...... *H01L 51/5256* (2013.01); *H01L 51/0021* (2013.01); *H01L 51/52* (2013.01);
(Continued)

(58) Field of Classification Search
CPC . H01L 51/0021; H01L 51/52; H01L 51/5221; H01L 51/5256; H01L 51/56
See application file for complete search history.

(56) References Cited

U.S. PATENT DOCUMENTS

2003/0017297 A1* 1/2003 Song .................. H01L 51/5253
428/68
2004/0232832 A1* 11/2004 Kubota ............... H01L 51/5256
313/512
(Continued)

FOREIGN PATENT DOCUMENTS

CN         102097450 A     6/2011
CN         103427039 A    12/2013
(Continued)

OTHER PUBLICATIONS

First Chinese Office Action regarding Application No. 201510116857.4 dated Jun. 2, 2016. English translation provided by Dragon Intellectual Property Law Firm.
(Continued)

*Primary Examiner* — Allan R Wilson
(74) *Attorney, Agent, or Firm* — Harness, Dickey & Pierce, P.L.C.

(57) ABSTRACT

The present disclosure provides an organic light-emitting diode packaging structure, a method for packaging an organic light-emitting diode and a display device. The packaging structure includes: a display area of an organic light-emitting diode arranged on a substrate; a cathode pattern arranged on the display area; a first inorganic blocking layer arranged on the cathode pattern; an organic buffer layer arranged on the first inorganic blocking layer, wherein the organic buffer layer is electrically connected at its edge to the cathode pattern in a peripheral area of the display area; and a second inorganic blocking layer, wherein the second
(Continued)

inorganic blocking layer is connected directly at its edge to the substrate in the peripheral area of the display area, so as to cover all the other layers.

20 Claims, 2 Drawing Sheets

(52) U.S. Cl.
CPC .......... *H01L 51/5221* (2013.01); *H01L 51/56* (2013.01); *H01L 2251/305* (2013.01); *H01L 2251/308* (2013.01)

(56) References Cited

U.S. PATENT DOCUMENTS

| | | | |
|---|---|---|---|
| 2005/0285521 A1* | 12/2005 | Menda | H01L 51/5253 313/512 |
| 2007/0114519 A1* | 5/2007 | Hayashi | H01L 51/5253 257/40 |
| 2012/0133275 A1 | 5/2012 | Lee et al. | |
| 2013/0240848 A1* | 9/2013 | Lin | H01L 51/52 257/40 |
| 2014/0014909 A1 | 1/2014 | Lee et al. | |
| 2015/0034926 A1 | 2/2015 | Nakata et al. | |
| 2016/0027852 A1 | 1/2016 | Qi et al. | |
| 2016/0254489 A1* | 9/2016 | Sun | H01L 51/56 257/40 |

FOREIGN PATENT DOCUMENTS

| | | |
|---|---|---|
| CN | 103700674 A | 4/2014 |
| CN | 103700675 A | 4/2014 |
| CN | 103904240 A | 7/2014 |
| CN | 104106310 A | 10/2014 |
| CN | 104183767 A | 12/2014 |
| CN | 104659271 A | 5/2015 |

OTHER PUBLICATIONS

Written Opinion of the International Searching Authority regarding International Application No. PCT/CN2015/086445.

* cited by examiner

ORGANIC LIGHT-EMITTING DIODE PACKAGING STRUCTURE, METHOD FOR PACKAGING ORGANIC LIGHT-EMITTING DIODE, AND DISPLAY DEVICE

CROSS-REFERENCE TO RELATED APPLICATION

This application is the U.S. national phase of PCT Application No. PCT/CN2015/086445 filed on Aug. 10, 2015, which claims a priority of the Chinese Patent Application No. 201510116857.4 filed on Mar. 17, 2015, the disclosures of which are incorporated in their entirety by reference herein.

TECHNICAL FIELD

The present disclosure relates to the field of organic light-emitting diode display technology, and in particular to an organic light-emitting diode packaging structure, a method for packaging an organic light-emitting diode and a display device.

BACKGROUND

For a top-emitting active matrix organic light emitting diode (AMOLED) display device, a cathode is generally made of conductive metal (e.g., Mg, Ag) and it is a one-piece lump-like electrode covering an array substrate. The cathode is required to have a high transmissivity and it is generally thin, so a resistance thereof is high. An IR drop may be increased because the cathode resistance is high, and a large IR drop may influence a uniformity of the display.

In the related art, the IR drop may be reduced by using a cathode auxiliary line. To be specific, a certain amount of cathode auxiliary lines are arranged in a non-pixel area of the array substrate and in a different layer with the cathode. However, an aperture ratio of the entire display device may be reduced if the cathode auxiliary lines are arranged in the non-pixel area (e.g., at the side of the gate lines, signal lines and power supply lines). In addition, if the cathode auxiliary lines are arranged at the side of the gate lines, signal lines and power supply lines, all the organic materials may be evaporated by using a fine metal mask (FMM) when evaporating the organic light-emitting materials, thereby an evaporation process of the organic light-emitting materials may be more difficult, efficiency may be influenced, the materials may be wasted, and then a manufacturing of an AMOLED may be difficult.

SUMMARY

In view of this, the present disclosure provides an organic light-emitting diode packaging structure, a method for packaging an organic light-emitting diode and a display device. By the packaging structure, an IR drop may be reduced without increasing a packaging difficulty or influencing an aperture ratio of a display device.

In a first aspect, an organic light-emitting diode packaging structure is provided by the present disclosure, including:
 a display area of an organic light-emitting diode arranged on a substrate;
 a cathode pattern arranged on the display area;
 a first inorganic blocking layer arranged on the cathode pattern;
 a first organic buffer layer arranged on the first inorganic blocking layer, wherein the first organic buffer layer is electrically connected at its edge to the cathode pattern in a peripheral area of the display area; and
 a second inorganic blocking layer, wherein the second inorganic blocking layer is connected directly at its edge to the substrate in the peripheral area of the display area, so as to cover all the other layers;
 wherein the first inorganic blocking layer and the second inorganic blocking layer are both transparent, and the first organic buffer layer is conductive and transparent.

Optionally, a plurality of inorganic blocking layers and a plurality of organic buffer layers are arranged alternately above the cathode pattern and between the cathode pattern and the second inorganic blocking layer, and each organic buffer layer is electrically connected at its edge to the cathode pattern in the peripheral area of the display area; wherein the plurality of inorganic blocking layers includes the first inorganic blocking layer, and the plurality of organic buffer layers includes the first organic buffer layer.

Optionally, each organic buffer layer is electrically connected at its edge to the cathode pattern directly in the peripheral area of the display area, or a first one of the organic buffer layers which is closest to the cathode pattern is electrically connected at its edge to the cathode pattern directly in the peripheral area of the display area, and the organic buffer layers excepting the first one of the organic buffer layers are electrically connected at their edges to the cathode pattern indirectly in the peripheral area of the display area.

Optionally, the first inorganic blocking layer and the second inorganic blocking layer are made of one or more of $Al_2O_3$, $TiO_2$, $ZrO_2$, MgO, $HFO_2$, $Ta_2O_5$, $Si_3N_4$, AlN, SiN, SiNO, SiO, $SiO_2$, SiC, SiCNx, ITO and IZO.

Optionally, the organic buffer layer is made of an organic transparent conductive resin.

Optionally, the organic transparent conductive resin includes a transparent matrix resin and conductive molecules and/or conductive particles.

In a second aspect, a display device is provided, including the organic light-emitting diode packaging structure hereinabove.

In a third aspect, a method for packaging an organic light-emitting diode is provided, including:
 forming a first inorganic blocking layer on a substrate including a display area of the organic light-emitting diode on which a cathode pattern is arranged;
 forming a first organic buffer layer on the first inorganic blocking layer, wherein the first organic buffer layer is electrically connected at its edge to the cathode pattern in a peripheral area of the display area;
 forming a second inorganic blocking layer, wherein the second inorganic blocking layer is connected directly at its edge to the substrate in the peripheral area of the display area, so as to cover all the other layers;
 wherein the first inorganic blocking layer and the second inorganic blocking layer are both transparent, and the first organic buffer layer is conductive and transparent.

Optionally, the method further includes: forming a plurality of inorganic blocking layers and a plurality of organic buffer layers alternately above the cathode pattern and between the cathode pattern and the second inorganic blocking layer, wherein each organic buffer layer is electrically connected at its edge to the cathode pattern in the peripheral area of the display area, wherein the plurality of inorganic blocking layers includes the first inorganic blocking layer, and the plurality of organic buffer layers includes the first organic buffer layer.

Optionally, the step of forming the inorganic blocking layers includes:
   depositing SiNx, SiCN and/or SiOx by vacuum deposition or magnetron sputtering; and
   forming the inorganic blocking layers by an etching patterning process using a mask.

Optionally, the first inorganic blocking layer and the second inorganic blocking layer are made of one or more of $Al_2O_3$, $TiO_2$, $ZrO_2$, MgO, $HFO_2$, $Ta_2O_5$, $Si_3N_4$, AN, SiN, SiNO, SiO, $SiO_2$, SiC, SiCNx, ITO and IZO.

Optionally, the organic buffer layer is made of an organic transparent conductive resin.

Optionally, the step of forming the organic buffer layer includes:
   processing the organic transparent conductive resin into a thin film by spin coating, or slot die coating, or spraying, or plasma enhanced chemical vapor deposition (PECVD), or vacuum thermal evaporation, or printing, and then thermo-curing the thin film.

Optionally, the organic transparent conductive resin is formed by mixing 1-60 parts by mass of a transparent matrix resin, 1-25 parts by mass of polyaniline doped with an organic acid, and 1-20 parts by mass of a crosslinked monomer into 30-95 parts by mass of methylbenzene and stirring a resultant mixture to dissolve the transparent matrix resin, polyaniline doped with the organic acid and the crosslinked monomer with methylbenzene completely; or by mixing a conductive particle with a high polymer monomer, a dispersant and a surfactant uniformly.

Optionally, the conductive particle is nanoscale $SiO_2$ mixed with antimony or nanoscale indium tin oxide or nano-silver.

Optionally, a size of the conductive particle is 20-100 nm.

According to the technical solution hereinabove, the present disclosure provides an organic light-emitting diode packaging structure, a method for packaging an organic light-emitting diode and a display device. By arranging an inorganic blocking layer in a cathode area, moisture and oxygen may be blocked. By arranging an organic buffer layer on the inorganic blocking layer, the buffering effect of the organic polymer in the organic light-emitting diode and the flexible packaging may be guaranteed. In addition, the organic buffer layer is conductive and transparent, and the organic buffer layer is electrically connected at its edge to the cathode pattern in a peripheral area of the display area, so a conductivity of the cathode pattern is improved without influencing a transmittance of the packaging, thereby reducing the IR drop without increasing a packaging difficulty or influencing an aperture ratio of a display device.

DETAILED DESCRIPTION

The embodiments of the present disclosure will be described hereinafter in conjunction with the drawings. The following embodiments are for illustrative purposes only, but shall not be used to limit the scope of the present disclosure.

An inorganic film may be used to form a moisture and oxygen blocking layer, but its elasticity is small and an innerstress thereof is large, so a flexible packaging may not be realized by using such inorganic film. However, an organic polymer has a large elasticity, which may restrain a cracking of the inorganic film and release a stress between the inorganic substances, and then the flexible packaging may be realized by using a combination of the inorganic film and the organic polymer.

The organic light-emitting diode packaging structure provided by some embodiments of the present disclosure is realized by the flexible packaging hereinabove.

Figure 1:
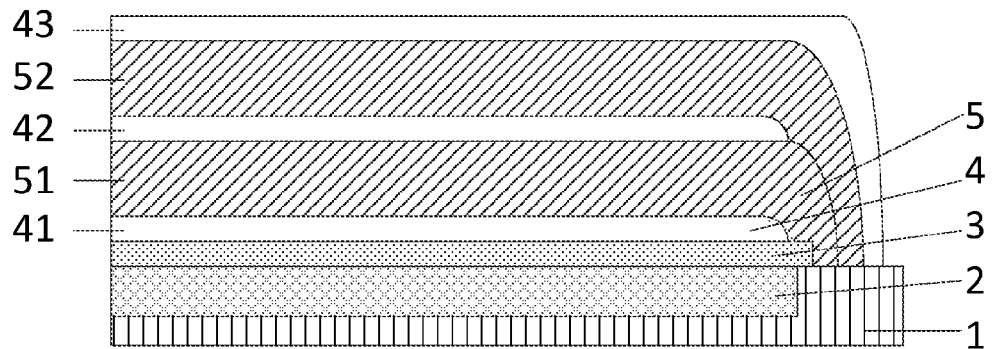
FIG. 1 is a schematic view showing an organic light-emitting diode packaging structure provided by some embodiments of the present disclosure.

To be specific, FIG. 1 is a schematic view showing an organic light-emitting diode packaging structure provided by some embodiments of the present disclosure. As shown in FIG. 1, the organic light-emitting diode packaging structure includes:
   a display area 2 of an organic light-emitting diode arranged on a substrate 1;
   a cathode pattern 3 arranged on the display area 2;
   a first inorganic blocking layer 41 arranged on the cathode pattern 3;
   a first organic buffer layer 51 arranged on the first inorganic blocking layer 41, wherein the first organic buffer layer 51 is electrically connected at its edge to the cathode pattern 3 in a peripheral area of the display area 2; and
   a second inorganic blocking layer 43, wherein the second inorganic blocking layer 43 is connected directly at its edge to the substrate in the peripheral area of the display area, so as to cover all the other layers.

The second inorganic blocking layer is of an area larger than the first buffer layer. The first inorganic blocking layer 41 and the second inorganic blocking layer 43 are both transparent, and the first organic buffer layer 51 is conductive and transparent.

According to the organic light-emitting diode packaging structure provided by some embodiments of the present disclosure, by arranging the first organic buffer layer on the first inorganic blocking layer, the buffering effect of the organic polymer in the organic light-emitting diode and the flexible packaging may be guaranteed. In addition, the first organic buffer layer is conductive and transparent, and the first organic buffer layer is electrically connected at its edge to the cathode pattern in a peripheral area of the display area, so a conductivity of the cathode pattern is improved without influencing a transmittance of the packaging, thereby reducing the IR drop without increasing a packaging difficulty or influencing an aperture ratio of a display device. In addition, the AMOLED may be protected better if the second inorganic blocking layer is arranged to cover all the other layers.

It should be understood that, the display area of the organic light-emitting diode refers to an area for display where the organic light-emitting diode is arranged, the cathode pattern includes cathodes for all the organic light-emitting diodes, which may cover the entire display area of the organic light-emitting diode, i.e., all the cathodes may be jointed together, and each organic light-emitting diode further includes an organic light-emitting layer and an anode.

It may be understood that, each of the first inorganic blocking layer and the second inorganic blocking layer is a film layer, which is made of inorganic materials including one of more of $Al_2O_3$, $TiO_2$, $ZrO_2$, MgO, $HFO_2$, $Ta_2O_5$, $Si_3N_4$, AlN, SiN, SiNO, SiO, $SiO_2$, SiC, SiCNx, ITO, IZO. These inorganic materials have both a good light-transmittance performance and a good moisture and oxygen blocking performance. When the organic light-emitting diode is packaged in such structure, the inorganic blocking layer may protect the AMOLED display panel without influencing a normal display thereof. When the inorganic material is ITO or IZO, which is a conductor, an impedance of the cathode may be reduced, and the IR drop may be reduced further.

According to some embodiments of the present disclosure, in the packaging structure hereinabove, a plurality of inorganic blocking layers 4 and a plurality of organic buffer layers 5 are arranged alternately above the cathode pattern 3 and between the cathode pattern 3 and the second inorganic blocking layer 43.

To be specific, a structure formed by arranging alternately the plurality of inorganic blocking layers 4 and the plurality of organic buffer layers 5 above the cathode pattern 3 may formed as follows: an edge of each organic buffer layer is beyond an edge of an inorganic blocking layer which the organic buffer layer covers, and each organic buffer layers is electrically connected at its edge to the cathode directly in the peripheral area of the display area. The connection may be performed in the followings two ways, including that each organic buffer layers is electrically connected at its edge to the cathode pattern directly in the peripheral area of the display area, as shown in FIG. 2E; or a first one of the organic buffer layers which is closest to the cathode pattern is electrically connected at its edge to the cathode pattern directly in the peripheral area of the display area, and the organic buffer layers excepting the first one of the organic buffer layers are electrically connected at their edges to the cathode pattern indirectly in the peripheral area of the display area, as shown in FIG. 1.

In order not to interfere the normal display of the AMOLED display panel and to improve a conductivity of the cathode pattern, the organic buffer layer hereinabove may be made of an organic transparent conductive resin. To be specific, the organic buffer layer may be made of a transparent matrix resin and conductive molecules and/or conductive particles. To be specific, the organic transparent conductive resin may be formed by mixing polyaniline doped with an organic acid, a crosslinked monomer into methylbenzene and stirring a resultant mixture to dissolve the polyaniline doped with the organic acid and the crosslinked monomer with methylbenzene completely; or by adding conductive molecules (e.g., polyaniline) into the transparent conductive resin hereinabove; or by adding conductive particles (e.g., nanoscale $SiO_2$ mixed with antimony) into the transparent conductive resin hereinabove. The added conductive particles may be nanoscale conductive particles such as indium tin oxide or nano-silver. Generally, a size of the conductive particle is 20-100 nm. It may be made a reference to the detailed description of the materials of the organic transparent conductive resin and a manufacturing method thereof hereinafter.

Because the organic material is more flexible than the inorganic material, a flexibility of the entire packaging structure may be improved when the organic buffer layers made of organic materials and the inorganic blocking layer made of inorganic materials are arranged alternately.

A method for packaging an organic light-emitting diode is further provided by some embodiments of the present disclosure, including:
  forming a first inorganic blocking layer 41 on a substrate comprising a display area of the organic light-emitting diode on which a cathode pattern is arranged;
  forming a first organic buffer layer 51 on the first inorganic blocking layer, wherein the first organic buffer layer is electrically connected at its edge to the cathode pattern in a peripheral area of the display area;
  forming a second inorganic blocking layer 43, wherein the second inorganic blocking layer is connected directly at its edge to the substrate in the peripheral area of the display area, so as to cover all the other layers;
  wherein the first inorganic blocking layer and the second inorganic blocking layer are both transparent, and the first organic buffer layer is conductive and transparent.

According to some embodiments of the present disclosure, there may be a plurality of organic buffer layers and a plurality of inorganic blocking layers. That is, the method further includes forming a plurality of inorganic blocking layers and a plurality of organic buffer layers alternately above the cathode pattern and between the cathode pattern and the second inorganic blocking layer, wherein each organic buffer layer is electrically connected at its edge to the cathode pattern in the peripheral area of the display area, wherein the plurality of inorganic blocking layers includes the first inorganic blocking layer, and the plurality of organic buffer layers includes the first organic buffer layer.

The method for packaging the packaging structure may be described in details by taking an example where the organic light-emitting diode packaging structure includes two organic buffer layers and three inorganic blocking layers and each organic buffer layer is electrically connected at its edge to the cathode pattern directly in the peripheral area of the display area. As shown in FIG. 2A to FIG. 2E, the method for packaging the AMOLED includes the following steps.

Figure 2A:
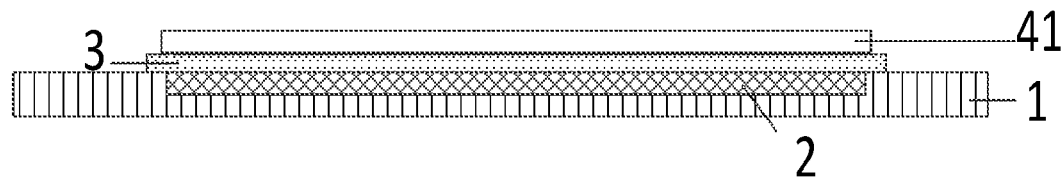
FIG. 2A-FIG. 2E show the structure in each step of packaging the organic light-emitting diode packaging structure provided by some embodiments of the present disclosure.

Step S1: manufacturing on a substrate an organic light-emitting diode area 2 and a cathode pattern 3, depositing on the cathode pattern 3 SiNx, SiCN and/or SiOx (or the materials hereinabove) by vacuum deposition or magnetron sputtering, and then forming the first inorganic blocking layers 41 by, for example, an etching patterning process using a mask, as shown in FIG. 2A.

To be specific, the edge of the first inorganic blocking layers 41 may cover the cathode pattern.

It may be understood that, those skilled in the art know the process of forming the inorganic blocking area by vacuum deposition or magnetron sputtering, and the description thereof is omitted herein.

Figure 2B:
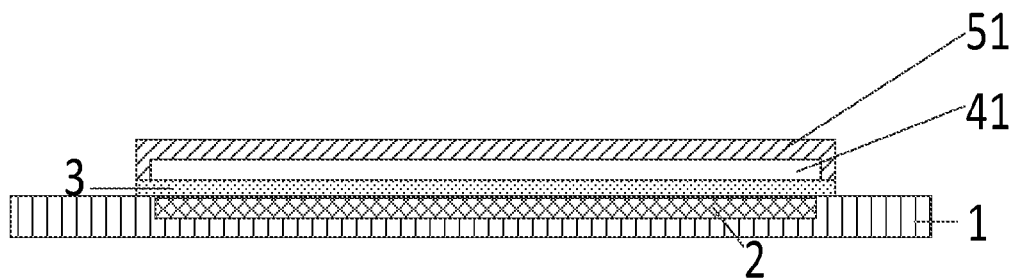

Step S2: forming a first organic buffer layer 51 on the first inorganic blocking layer 41, wherein the first organic buffer layer 51 is electrically connected at its edge to the cathode pattern directly in a peripheral area of the display area. As shown in FIG. 2B, the first organic buffer layer 51 is made of organic transparent conductive resin.

To be specific, an edge of the first organic buffer layer 51 is beyond an edge of the first inorganic blocking layer 41, the first organic buffer layer 51 is electrically connected at its edge to the cathode pattern 3 directly in a peripheral area of the display area, so a conductivity of the cathode pattern is improved.

The organic transparent conductive resin may be processed into a thin film by spin coating, or slot die coating, or spraying, or plasma enhanced chemical vapor deposition (PECVD), or vacuum thermal evaporation, or printing, and then the thin film may be subjected to a thermo-curing.

When the organic transparent conductive resin is processed into a thin film by PECVD or vacuum thermal evaporation, the pattern of the first organic buffer layer may be formed by a single patterning process.

In a process of evaporating the organic conductive resin, a common metal mask with a large opening may be used and a fine FMM is not needed. Therefore, it is able to reduce a difficulty of evaporating the organic light-emitting material and improve the manufacturing efficiency.

To be specific, the method for manufacturing the organic transparent conductive resin includes:

mixing 1-60 parts by mass of a transparent matrix resin, 1-25 parts by mass of polyaniline doped with an organic acid, and 1-20 parts by mass of a crosslinked monomer into 30-95 parts by mass of methylbenzene and stirring a resultant mixture to dissolve the transparent matrix resin, polyaniline doped with the organic acid and the crosslinked monomer with methylbenzene completely; or mixing a conductive particle (e.g., nanoscale $SiO_2$ mixed with antimony) with a high polymer monomer, a dispersant and a surfactant uniformly.

According to some embodiments of the present disclosure, the conductive particle hereinabove may be nanoscale $SiO_2$ mixed with antimony or nanoscale indium tin oxide or nano-silver. A size of the conductive particle is 20-100 nm.

Figure 2C:
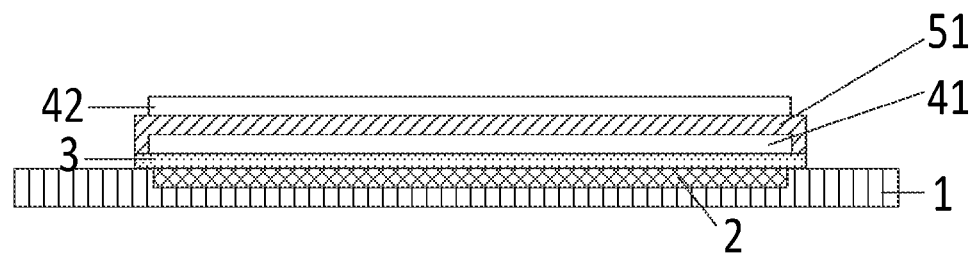

Step S3: forming a third inorganic blocking layer 42 on the first organic buffer layer 51, as shown in FIG. 2C.

The method for forming the third inorganic blocking layer 42 is the same as the method for forming the first organic blocking layer 41 in Step 1, and the detailed description thereof is omitted herein.

Figure 2D:
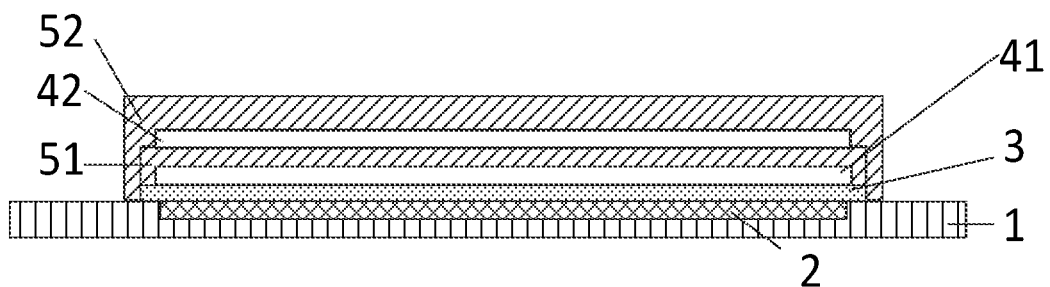
Figure 2E:
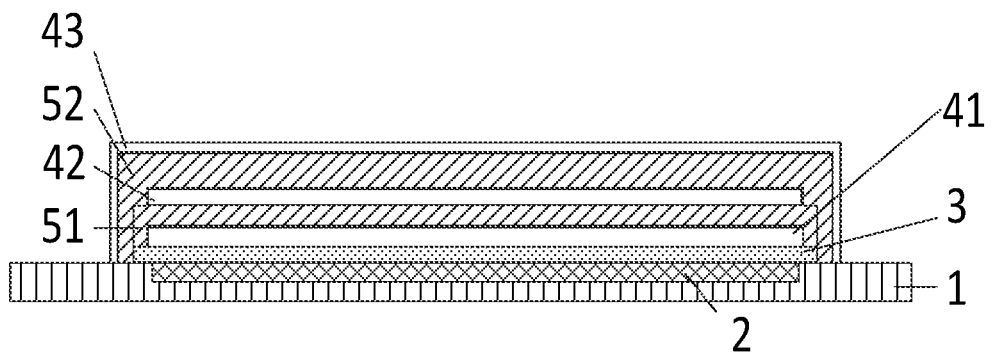

Step S4: forming a second organic buffer layer 52 on the third inorganic blocking layer 42, as shown in FIG. 2D.

The method for forming the second organic buffer layer 52 is the same as the method for forming the first organic buffer layer 51 in Step S2 and the detailed description thereof is omitted herein.

It should be noted that, an edge of the second organic buffer layer 52 is beyond an edge of the third inorganic blocking layer 42, and the second organic buffer layer 52 is electrically connected at its edge to the cathode pattern directly in a peripheral area of the display area.

Step S5: forming a second inorganic blocking layer 43 on the second organic buffer layer 52, as shown in FIG. 2D. SiNx, SiCN and/or SiOx is deposited by vacuum deposition or magnetron sputtering, and the second inorganic blocking layers 43 are formed by an etching patterning process using a mask.

The second inorganic blocking layer 43 covers all the other layers. The materials of the inorganic blocking layers are transparent, which have both a good light-transmittance performance and a good moisture and oxygen blocking performance, thereby protecting the AMOLED display panel without influencing a normal display thereof.

According to the method hereinabove, the organic buffer layer is deposited on the cathode pattern, which is both conductive and transparent and connected to the cathode pattern, such that a conductivity of the cathode pattern is improved without influencing a transmittance of the packaging, thereby reducing the IR drop without increasing a packaging difficulty or influencing an aperture ratio of a display device. In addition, because the organic buffer layer is more flexible than the inorganic blocking layer, a flexibility of the packaging structure may be improved when the organic buffer layers and the inorganic blocking layer are arranged alternately, thereby guaranteeing the buffering effect of the organic polymer in the organic light-emitting diode.

According to some embodiments of the present disclosure, an area of the first inorganic blocking layer is smaller than both an area of the cathode pattern and an area of the first organic buffer layer, such that the first organic buffer layer is connected to the cathode pattern. For the packaging structure formed by alternately arranging a plurality of inorganic blocking layers 4 and a plurality of organic buffer layers 5, it is only limited that the area of the first inorganic blocking layer is smaller than both the area of the cathode pattern and the area of the organic buffer layer and then the first organic buffer layer is connected to the cathode pattern, while the areas of the other inorganic blocking layers and the organic buffer layers are not limited. In addition, the numbers of inorganic blocking layers and the organic buffer layers and the required times of patterning process are not limited.

A display device is further provided by some embodiments of the present disclosure, including the organic light-emitting diode packaging structure hereinabove. The display device provided by some embodiments of the present disclosure may be any product or component with display function such as electronic books, cell phones, tablet PCs, televisions, laptops, digital photo frames, and navigators.

It should be understood that, the OLED packaging structure and the packaging method provided by the present disclosure is applicable to both a top-emitting AMOLED apparatus and the other similar apparatus.

According to the organic light-emitting diode packaging structure provided by some embodiments of the present disclosure, that the resistant of the cathode is increased and the IR drop is too large due to the thin cathode can be prevented, so that the uniformity of the image displayed by the display device may be better, and it is able to prevent the display quality from being adversely affected.

It should be noted that, the direction or position relationship indicated by such words as "on", "under" is based on the direction or position relationship shown in the drawings, which is merely used to simplify the description, rather than to indicate or imply that the device or component indicated is at a certain position or formed or operated at the certain position, so the present disclosure is not limited herein. Such words as "first" and "second" are merely used to differentiate different entities or operations rather than to require or imply any order or relationship of the entities or operations. In addition, such words as "comprise" and "comprising" or any other variants thereof refers to a non-exclusive including, such that a process, a method, an object or a device including a series of elements not only include these elements but also the other elements which are not described definitely or the inherent elements of such process, method, object or device. Without further limitations, the elements defined by such words as "comprises a . . . ", it not exclusive that process, method, object or device including the elements further include other identical elements.

A lot of details have been described in the specification. However, it may be understood that the present disclosure may be implemented without theses details. In some examples, the conventional method, structure and technology are not described in details, such that the specification may be understood clearly.

At last, it should be noted that, the embodiments hereinabove are merely to describe the technical solution of the present disclosure, rather than to limit the present disclosure. Although the present disclosure is described in conjunction with the embodiments hereinabove, those skilled in the art may still modify the technical solution in the embodiments hereinabove, or further replace the technical features partially or completely, and these modifications and improvements shall also fall within the scope of the present disclosure.

What is claimed is:

1. An organic light-emitting diode packaging structure, comprising:
    a display area of an organic light-emitting diode arranged on a substrate;

a cathode pattern arranged on the display area;
a first inorganic blocking layer arranged on the cathode pattern;
a first organic buffer layer arranged on the first inorganic blocking layer, wherein the first organic buffer layer is electrically connected at its edge to the cathode pattern in a peripheral area of the display area; and
a second inorganic blocking layer, wherein the second inorganic blocking layer is connected directly at its edge to the substrate in the peripheral area of the display area, so as to cover all the other layers;
wherein the first inorganic blocking layer and the second inorganic blocking layer are both transparent, and the first organic buffer layer is conductive and transparent.

2. The packaging structure according to claim 1, wherein a plurality of inorganic blocking layers and a plurality of organic buffer layers are arranged alternately above the cathode pattern and between the cathode pattern and the second inorganic blocking layer, and each organic buffer layer is electrically connected at its edge to the cathode pattern in the peripheral area of the display area;
wherein the plurality of inorganic blocking layers comprises the first inorganic blocking layer, and the plurality of organic buffer layers comprises the first organic buffer layer.

3. The packaging structure according to claim 2, wherein each organic buffer layer is electrically connected at its edge to the cathode pattern directly in the peripheral area of the display area, or
a first one of the organic buffer layers which is closest to the cathode pattern is electrically connected at its edge to the cathode pattern directly in the peripheral area of the display area, and the organic buffer layers excepting the first one of the organic buffer layers are electrically connected at their edges to the cathode pattern indirectly in the peripheral area of the display area.

4. The packaging structure according to claim 1, wherein the first inorganic blocking layer and the second inorganic blocking layer are made of one or more of $Al_2O_3$, $TiO_2$, $ZrO_2$, MgO, $HFO_2$, $Ta_2O_5$, $Si_3N_4$, AlN, SiN, SiNO, SiO, $SiO_2$, SiC, SiCNx, ITO and IZO.

5. The packaging structure according to claim 1, wherein the organic buffer layer is made of an organic transparent conductive resin.

6. The packaging structure according to claim 5, wherein the organic transparent conductive resin comprises a transparent matrix resin and conductive molecules and/or conductive particles.

7. A display device, comprising the organic light-emitting diode packaging structure according to claim 1.

8. The packaging structure according to claim 2, wherein the organic buffer layer is made of an organic transparent conductive resin.

9. The packaging structure according to claim 3, wherein the organic buffer layer is made of an organic transparent conductive resin.

10. The packaging structure according to claim 4, wherein the organic buffer layer is made of an organic transparent conductive resin.

11. The display device according to claim 7, wherein a plurality of inorganic blocking layers and a plurality of organic buffer layers are arranged alternately above the cathode pattern and between the cathode pattern and the second inorganic blocking layer, and each organic buffer layer is electrically connected at its edge to the cathode pattern in the peripheral area of the display area;
wherein the plurality of inorganic blocking layers comprises the first inorganic blocking layer, and the plurality of organic buffer layers comprises the first organic buffer layer.

12. A method for packaging an organic light-emitting diode, comprising:
forming a first inorganic blocking layer on a substrate comprising a display area of the organic light-emitting diode on which a cathode pattern is arranged;
forming a first organic buffer layer on the first inorganic blocking layer, wherein the first organic buffer layer is electrically connected at its edge to the cathode pattern in a peripheral area of the display area;
forming a second inorganic blocking layer, wherein the second inorganic blocking layer is connected directly at its edge to the substrate in the peripheral area of the display area, so as to cover all the other layers;
wherein the first inorganic blocking layer and the second inorganic blocking layer are both transparent, and the first organic buffer layer is conductive and transparent.

13. The method according to claim 12, further comprising:
forming a plurality of inorganic blocking layers and a plurality of organic buffer layers alternately above the cathode pattern and between the cathode pattern and the second inorganic blocking layer, wherein
each organic buffer layer is electrically connected at its edge to the cathode pattern in the peripheral area of the display area,
the plurality of inorganic blocking layers comprises the first inorganic blocking layer, and
the plurality of organic buffer layers comprises the first organic buffer layer.

14. The method according to claim 12, wherein the step of forming the inorganic blocking layers comprises:
depositing SiNx, SiCN and/or SiOx by vacuum deposition or magnetron sputtering; and
forming the inorganic blocking layers by an etching patterning process using a mask.

15. The method according to claim 12, wherein the first inorganic blocking layer and the second inorganic blocking layer are made of one or more of $Al_2O_3$, $TiO_2$, $ZrO_2$, MgO, $HFO_2$, $Ta_2O_5$, $Si_3N_4$, AlN, SiN, SiNO, SiO, $SiO_2$, SiC, SiCNx, ITO and IZO.

16. The method according to claim 12, wherein the organic buffer layer is made of an organic transparent conductive resin.

17. The method according to claim 16, wherein the step of forming the organic buffer layer comprises:
processing the organic transparent conductive resin into a thin film by spin coating, or slot die coating, or spraying, or plasma enhanced chemical vapor deposition (PECVD), or vacuum thermal evaporation, or printing, and then thermo-curing the thin film.

18. The method according to claim 16, wherein the organic transparent conductive resin is formed by mixing 1-60 parts by mass of a transparent matrix resin, 1-25 parts by mass of polyaniline doped with an organic acid, and 1-20 parts by mass of a crosslinked monomer into 30-95 parts by mass of methylbenzene and stirring a resultant mixture to dissolve the transparent matrix resin, polyaniline doped with the organic acid and the crosslinked monomer with methylbenzene completely; or
by mixing a conductive particle with a high polymer monomer, a dispersant and a surfactant uniformly.

19. The method according to claim 18, wherein the conductive particle is nanoscale SiO$_2$ mixed with antimony or nanoscale indium tin oxide or nano-silver.

20. The method according to claim 19, wherein a size of the conductive particle is 20-100 nm.

* * * * *